United States Patent
Shono et al.

(10) Patent No.: US 8,423,798 B2
(45) Date of Patent: Apr. 16, 2013

(54) PORTABLE ELECTRONIC APPARATUS AND METHOD FOR DISPLAYING IMAGE

(75) Inventors: Atsuo Shono, Tokyo (JP); Takehiko Tanaka, Tokyo (JP)

(73) Assignee: Fujitsu Mobile Communications Limited, Kawasaki (JP)

( * ) Notice: Subject to any disclaimer, the term of this patent is extended or adjusted under 35 U.S.C. 154(b) by 337 days.

(21) Appl. No.: 12/406,833

(22) Filed: Mar. 18, 2009

(65) Prior Publication Data

US 2010/0026504 A1 Feb. 4, 2010

(30) Foreign Application Priority Data

Aug. 1, 2008 (JP) ................................. 2008-199906

(51) Int. Cl.

| G06F 1/00 | (2006.01) |
|---|---|
| G06F 1/26 | (2006.01) |
| G06F 3/038 | (2006.01) |
| G06F 15/00 | (2006.01) |
| G06F 13/00 | (2006.01) |
| G06F 3/00 | (2006.01) |
| H02J 7/00 | (2006.01) |
| G08B 21/00 | (2006.01) |
| G01R 31/36 | (2006.01) |
| H04M 1/00 | (2006.01) |

(52) U.S. Cl.
USPC ........... 713/300; 713/310; 713/320; 713/340; 320/136; 340/636.1; 345/204; 345/501; 702/63; 710/110; 112/28; 112/32; 725/39; 455/574

(58) Field of Classification Search .................. 713/300, 713/310, 320, 340; 320/136; 340/636.1; 345/204, 501; 702/63; 710/110; 712/28, 712/32; 725/39; 455/574

See application file for complete search history.

(56) References Cited

U.S. PATENT DOCUMENTS 7,639,743 B2 * 12/2009 Kyusojin ................ 375/240.25
7,669,217 B2 * 2/2010 Morioka et al. ............... 725/49
7,738,023 B2 * 6/2010 Suzuki .......................... 348/317

(Continued)

FOREIGN PATENT DOCUMENTS

| JP | 2007-235527 A | 9/2007 |
| JP | 2008-028850 A | 2/2008 |
| JP | 2008-124646 A | 5/2008 |
| WO | WO 2006095574 A1 * | 9/2006 |

OTHER PUBLICATIONS

JP Office Action mailed on Sep. 25, 2012 as received in application No. 2008-199906.

Primary Examiner — Stefan Stoynov
(74) Attorney, Agent, or Firm — Maschoff Brennan (57) ABSTRACT

A portable electronic apparatus configured to be battery-powered and to display a visual program received from the outside is provided. The portable electronic apparatus has a receiver configured to receive EPG data related to the program, a battery power estimator configured to estimate remaining battery power, an image processor configured to process an image included in the program by using a plurality of functions of image quality control, and a controller configured to set how to use each of the functions by means of the image processor. The controller is configured to estimate battery lasting time on the basis of the remaining battery power, a setting of the use of the functions and the EPG data. The controller is configured to update the setting of the use of the functions upon judging the remaining battery power to be short of enough to display the program to the end.

37 Claims, 3 Drawing Sheets

U.S. PATENT DOCUMENTS

| | | | |
|---|---|---|---|
| 7,825,818 B2 * | 11/2010 | Yoon | 340/636.1 |
| 2003/0123844 A1 * | 7/2003 | Toma et al. | 386/46 |
| 2003/0142087 A1 * | 7/2003 | Shiotsu et al. | 345/211 |
| 2005/0046390 A1 * | 3/2005 | Kimura | 320/132 |
| 2008/0055311 A1 * | 3/2008 | Aleksic et al. | 345/428 |
| 2009/0023482 A1 * | 1/2009 | Koura et al. | 455/574 |

* cited by examiner

| | SWITCH TO ONE-SEG | FRAME INTER-POLATION OFF | FRAME THIN-NING ON | ENHANCER OFF | GRADATION/COLOR CORRECTION OFF | BRIGHTNESS DECREASE | PROGRAM EXAMPLES |
|---|---|---|---|---|---|---|---|
| Ex A | 4 | 1 | 3 | 2 | 5 | 6 | MOVIE |
| Ex B | 1 | 2 | 4 | 5 | 6 | 3 | WHETHER FORECAST |
| Ex C | 6 | 1 | 5 | 4 | 3 | 2 | NEWS |
| Ex D | 5 | 4 | 6 | 2 | 3 | 1 | SPORTS |
| Ex E | 1 | 2 | 6 | 5 | 4 | 3 | MAIL ORDER |

PORTABLE ELECTRONIC APPARATUS AND METHOD FOR DISPLAYING IMAGE

CROSS REFERENCE TO RELATED APPLICATIONS

This application is based upon and claims the benefit of priority from the prior Japanese Patent Application No. 2008-199906 filed on Aug. 1, 2008; the entire contents of which are incorporated herein by reference.

BACKGROUND OF THE INVENTION

1. Field of the Invention

The present invention relates to a portable electronic apparatus and a method for displaying an image, and in particular to a portable electronic apparatus configured to control image quality.

2. Description of the Related Art

It is well known that some battery-powered electronic apparatuses such as mobile phones or personal computers have a receiver for receiving TV broadcasting such as digital terrestrial television broadcasting, as disclosed in, e.g., Japanese Patent Publication of Unexamined Applications (Kokai), No. 2007-235527. These days, high image quality of TV programs can be enjoyed owing to advanced image processing technology.

Image processing for improving the image quality, however, increases power consumption, and reduces battery lasting time of a portable battery-powered electronic apparatus, thereby. Thus, a display of a TV program that requires image processing may cause a problem that reduces lots of convenience of a user in that another essential function of the apparatus such as communication does not work in case of need, or that the user cannot view the program to the end.

An electronic apparatus usually increases power consumption due to image processing for improving image quality, and reduces battery lasting time. Thus, a display of a TV program that requires image processing may cause a problem that reduces lots of convenience of the user in that another essential function of the apparatus does not work in case of need, or that the user cannot view the program to the end.

SUMMARY OF THE INVENTION

Accordingly, an advantage of the present invention is to provide a portable electronic apparatus and a method for image processing adapted for preventing a problem in that a display of a TV program causes another function not to work in case of need, and for increasing convenience of the user, thereby.

To achieve the above advantage, one aspect of the present invention is to provide a portable electronic apparatus configured to be battery-powered and to display a visual program received from the outside. The portable electronic apparatus has a receiver configured to receive EPG data related to the program, a battery power estimator configured to estimate remaining battery power, an image processor configured to process an image included in the program by using a plurality of functions of image quality control, and a controller configured to set how to use each of the functions by means of the image processor. The controller is configured to estimate battery lasting time on the basis of the remaining battery power, a setting of the use of the functions and the EPG data. The controller is configured to update the setting of the use of the functions upon judging the remaining battery power to be short of enough to display the program to the end.

DETAILED DESCRIPTION OF THE INVENTION

Figure 1:
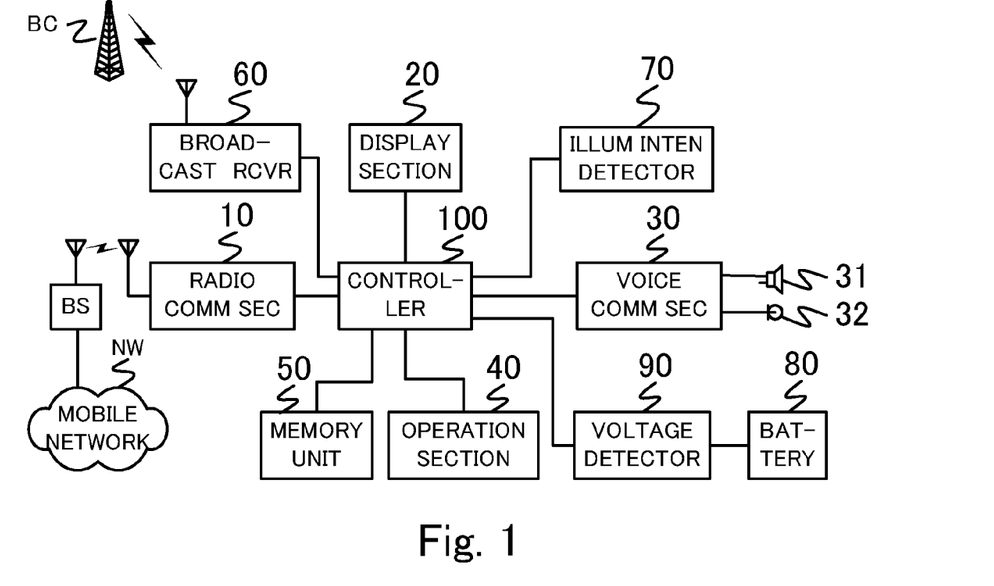
FIG. 1 is a circuit block diagram of a portable electronic apparatus of an embodiment of the invention.

An embodiment of the present invention will be described with reference to FIGS. 1-5. FIG. 1 is a block diagram of a portable electronic apparatus of the embodiment of the present invention, which is exemplified by a mobile phone configured to receive digital terrestrial TV broadcasting (hereinafter shortened as DTTB). The electronic apparatus of the embodiment has a controller 100, a radio communication section 10, a display section 20, a voice communication section 30, an operation section 40, a memory section 50, a broadcast receiver 60, an illumination intensity detector 70, a battery 80 and a voltage detector 90. The electronic apparatus of the embodiment has a function to communicate through a base station BS and a mobile communication network NW, and a function to receive a DTTB signal sent from a broadcasting station BC.

The radio communication section 10 is configured to communicate by radio with the base station BS included in the mobile communication network NW as directed by the controller 100, to send and receive voice and email data and to receive web and streaming data and so on by way of the radio communication. The display section 20 is a display device including, e.g., a liquid crystal display (LCD) device or an organic electroluminescence display device. The display section 20 is configured to display an image (still or moving) and text so as to visually provide a user with information.

The voice communication section 30, having a speaker 31 and a microphone 31, is configured to convert voice of the user into voice data so as to provide the controller 100 with the voice data, and to decode voice data received from the other party so as to produce the decoded voice from the speaker 31. The operation section 40, having a plurality of operation keys and so on, is a device through which the user gives his or her instruction.

The memory section 50 is configured to store a control program and control data of the controller 100, application software, directory data including a name and an associated phone number of the other party, data of sent and received emails, web data downloaded from the web and downloaded content data. The memory section 50 is configured to temporarily store streaming data and so on. The memory section 50 can be constituted by one or a combination of an HDD, a RAM, a ROM, a flash memory and so on.

The broadcast receiver 60 is a tuner configured to receive a DTTB signal broadcasted from the broadcasting station BC. The broadcast receiver 60 is configured to receive full-segment and one-segment DTTB signals. The broadcast receiver 60 is configured to obtain broadcasting data (encoded stream) from the received signal. The illumination intensity detector 70 is configured to detect intensity of illumination around the portable electronic apparatus, e.g., intensity of incident light on a front face of the display section 20.

The battery 80 is configured to be charged with electric power for driving the portable electronic apparatus. The battery 80 is a re-chargeable battery formed by including lithium ion, nickel-hydrogen or a fuel cell. The battery 80 is configured to provide each of the portions of the portable electronic apparatus with the electric power stored in the battery 80 so as to drive the portions, as controlled by the controller 100. The voltage detector 90 is configured to detect an output voltage of the battery 80. The controller 100 is configured to estimate the electric power stored in the battery 80 by using the voltage detected by the voltage detector 90.

The controller 100 has a microprocessor, and is configured to operate in accordance with the control program and the control data stored in the memory section 50, and to supervise each of the portions of the portable electronic apparatus so as to perform voice and data communication. The controller 100 is configured to operate in accordance with the application software stored in the memory section 50. The controller 100 has a communication control function for sending and receiving emails, web browsing, displaying moving images on the display section 20 on the basis of the downloaded streaming data, and performing voice communication.

The controller 100 has a brightness control function for controlling brightness of the display section 20 in response to a detection output of the illumination intensity detector 70. That is, if the illumination intensity detector 70 detects an illumination intensity that is greater than a preset threshold, the controller 100 increases the brightness of the display section 20 so as to make the display on the display section 20 easy to see. Meanwhile, if the illumination intensity detector 70 detects an illumination intensity that is no greater than the preset threshold, the controller 100 decreases the brightness of the display section 20 so as to reduce dazzling of the display section 20. The controller 100 includes, as described later, a supervisory controller 110 having a brightness control function that is given priority over the brightness control function described above.

Figure 2:
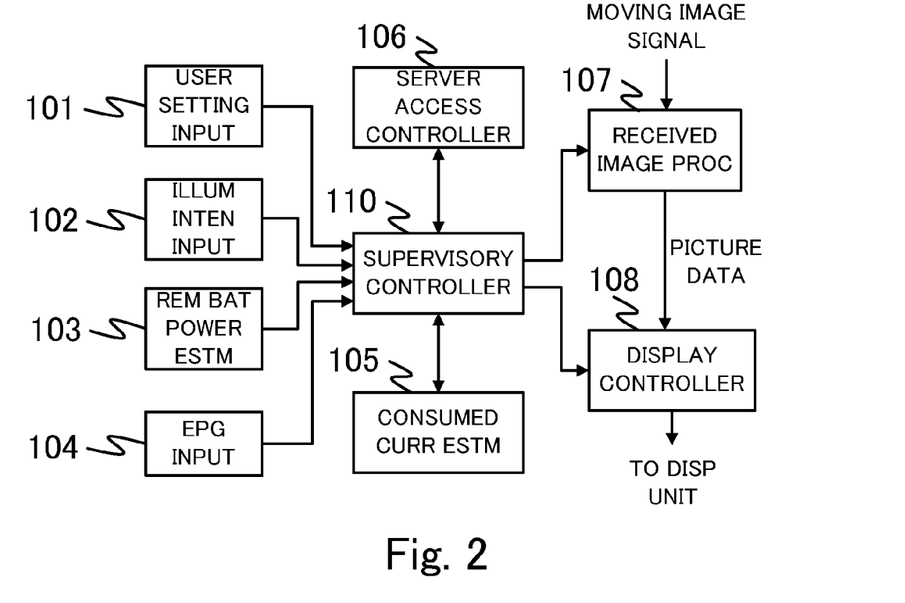
FIG. 2 is a circuit block diagram of a controller of the portable electronic apparatus shown in FIG. 1.

The controller 100 has control functions, as shown in FIG. 2, for improving quality of an image displayed on the display section 20, and for reducing power consumption. That is, the controller 100 has a user setting input section 101, an illumination intensity input section 102, a remaining battery power estimator 103, an EPG input section 104, a consumed current estimator 105. a server access controller 106, a received image processor 107, a display controller 108 and the supervisory controller 110.

The user setting input section 101 is configured to obtain information set by the user (called user setting information hereafter) through the operation section 40 as directed by the supervisory controller 110. The user setting input section 101 is configured to provide the supervisory controller 110 with the user setting information.

The user setting information includes pieces of information regarding operation of the portable electronic apparatus of the embodiment, e.g., receiving one-segment broadcasting or full-segment broadcasting, performing frame interpolation or not, performing frame decimation or not, performing an enhancement process by means of an enhancer or not, correcting gradation or color or not, setting of the display brightness, and so on.

The illumination intensity input section 102 is configured to obtain the illumination intensity detected by the illumination intensity detector 70 (called detected illumination intensity hereafter) as directed by the supervisory controller 110. The illumination intensity input section 102 is configured to provide the supervisory controller 110 with the detected illumination intensity.

The remaining battery power estimator 103 is configured to estimate a level of the power stored in the battery 80 as directed by the supervisory controller 110 and on the basis of the voltage detected by the voltage detector 90. The remaining battery power estimator 103 is configured to provide the supervisory controller 110 with the estimated power level (called remaining battery power, hereafter).

The EPG input section 104 is configured to obtain an electronic program guide (EPG) from broadcast data received by the broadcast receiver 60 as directed by the supervisory controller 110. The EPG input section 104 is configured to provide the supervisory controller 110 with the electronic program guide obtained here.

The consumed current estimator 105 is configured to estimate a value of a current required for displaying TV broadcasting on the basis of image processing setting information, the detected illumination intensity and the electronic program guide notified by the supervisory controller 110. The consumed current estimator 105 is configured to provide the supervisory controller 110 with the estimated current value (called consumed current value hereafter).

Figure 3:
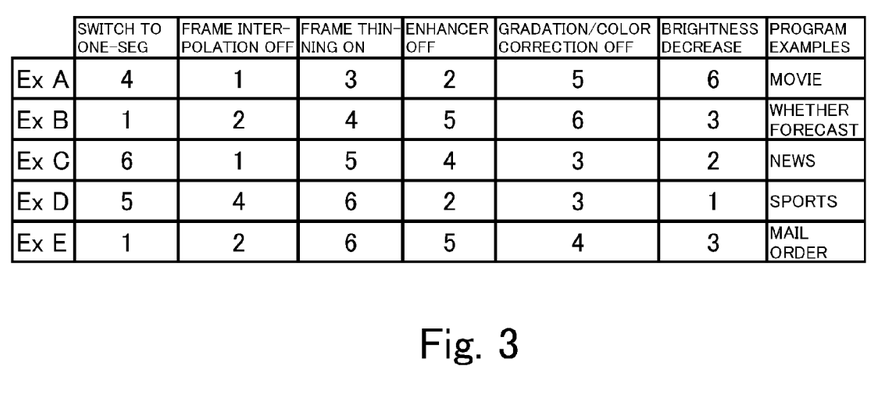
FIG. 3 shows examples of control information that a server access controller shown in FIG. 2 obtains.

The server access controller 106 is configured to control the radio communication section 10 as directed by the supervisory controller 110 so as to join the mobile communication network NW through the base station BS. The server access controller 106 has a communication control function for connecting to a pre-selected server by way of the Internet, and obtaining control information from the server. FIG. 3 shows an example of the control information.

FIG. 3 shows five examples of the control information indicated by "Ex A"-"Ex E". The server access controller 106 obtains one of such examples as the control information. That is, the server provides, in accordance with a genre of the program that is currently viewed, the portable electronic apparatus with the control information corresponding to the program. The control information gives priority of the functions each of which can be selected whether to be performed while the broadcasting program is viewed.

Figure 4:
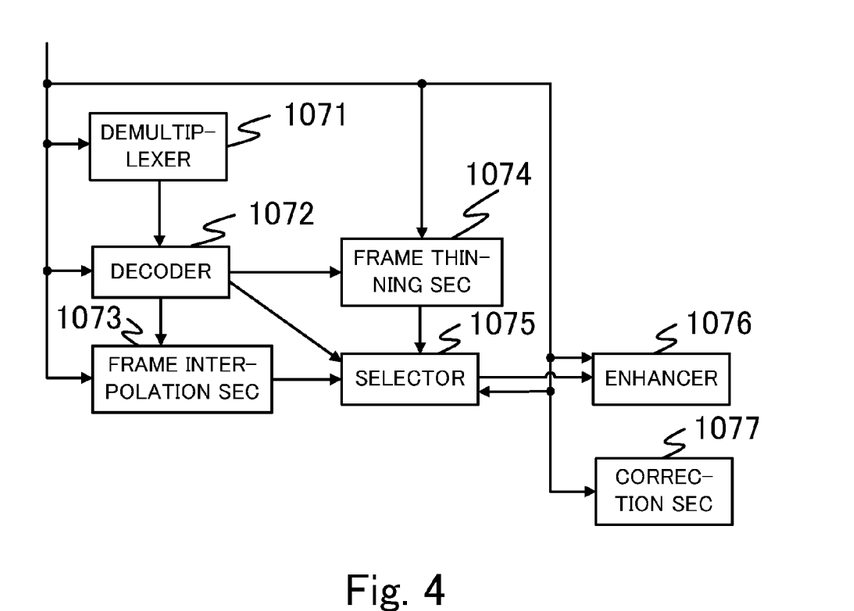
FIG. 4 is a circuit block diagram of a received image processing section shown in FIG. 2.

The received image processor 107 is configured to perform image processing on a moving image signal in accordance with the image processing setting information notified from the supervisory controller 110 so as to obtain a video signal. The received image processor 107 is configured, e.g., as shown in FIG. 4. That is, the received image processor 107 has a demultiplexer 1071, a decoder 1072, a frame interpolation section 1073, a frame decimating section 1074, a selector 1075, an enhancer 1076 and a correction section 1077.

The demultiplexer 1071 is configured to select one of full-segment and one-segment broadcasting data from the broadcasting data obtained by the broadcast receiver 60 in accordance with the image processing setting information notified from the supervisory controller 110. The demultiplexer 1071 is configured to provide the decoder 1072 with the selected broadcasting data.

The decoder 1072 is configured to decode the broadcasting data provided by the demultiplexer 1071 so as to obtain video data frame by frame. The decoder 1072 is configured to provide one of the frame interpolation section 1073, the frame decimating section 1074 and the selector 1075 with the above video data in accordance with the image processing setting information notified from the supervisory controller 110.

The frame interpolation section 1073 is configured to operate in accordance with the image processing setting information notified from the supervisory controller 110. The frame interpolation section 1073 is configured to produce, on the basis of the video data of the plural frames provided by the decoder 1072, video data of a frame to be interpolated into the above frames. The frame interpolation section 1073 is configured to provide the selector 1075 with the video data provided by the decoder 1072 and the video data of the interpolated frame in order of reproducing.

The frame decimating section 1074 is configured to operate in accordance with the image processing setting information notified from the supervisory controller 110. The frame decimating section 1074 is configured to decimate the video data of the plural frames provided by the decoder 1072 at a preset rate, and to provide the selector 1075 with the video data of the remaining frames only.

The selector 1075 is configured to judge which of the frame interpolation section 1073, the frame decimating section 1074 and the decoder 1072 provides the video data, and to provide the enhancer 1076 with the video data provided by the judged one of the above.

The enhancer 1076 is configured to operate in accordance with the image processing setting information notified from the supervisory controller 110. The enhancer 1076 is configured to correct the video data provided by the selector 1075 for enhancing an edge of the image, so as to provide the correction section 1077 with the corrected video data. Meanwhile, the enhancer 1076 may be off work and pass the video data provided by the selector 1075 as it is to the correction section 1077.

The correction section 1077 is configured to operate in accordance with the image processing setting information notified from the supervisory controller 110. The correction section 1077 is configured to correct gradation and color of the video data provided by the enhancer 1076, and to provide the display controller 108 with the corrected video data. Meanwhile, the correction section 1077 may be off work and pass the video data provided by the enhancer 1076 as it is to the display controller 108.

The display controller 108 is configured to display an image on the display section 20 on the basis of the video data provided by the correction section 1077 as directed by the supervisory controller 110. The display controller 108 is configured to control brightness of the image displayed on the display section 20 in accordance with the image processing setting information notified from the supervisory controller 110.

The supervisory controller 110 is configured to supervise and control each of the portions of the controller 100. The supervisory controller 110 is configured to produce the image processing setting information, to notify the consumed current estimator 105 of the image processing setting information, the detected illumination intensity and the electronic program guide, and to direct the consumed current estimator 105 to estimate the consumed current value. The supervisory controller 110 is configured to estimate remaining time of the program that is currently viewed on the basis of the electronic program guide and present time. The supervisory controller 110 is configured to control the received image processor 107 and the display controller 108 on the basis of the remaining time, the above consumed current value and the remaining battery power so that the user can view the program to the end.

Then, an operation of the portable electronic apparatus configured as described above will be explained with reference to FIG. 5. An operation for the communication function performed as a mobile phone will be omitted to be explained, and an operation for viewing DTTB will be explained.

Figure 5:
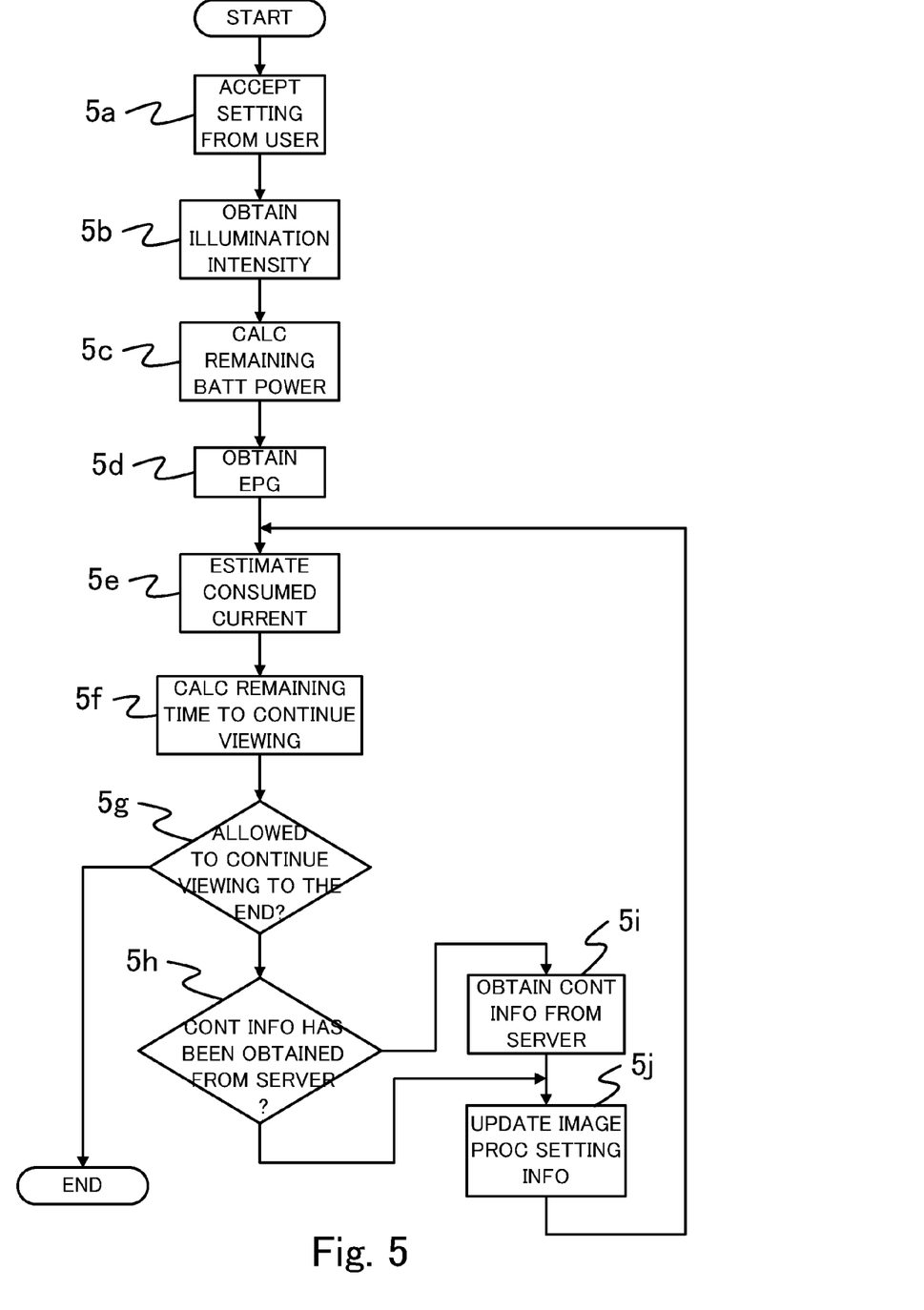
FIG. 5 is a flowchart of an operation of the portable electronic apparatus shown in FIG. 1 for receiving TV broadcasting.

The control program that the operation described below is based on is stored in the memory section 50, and the controller 100 runs the control program so as to perform the operation. If the user makes a request for viewing DTTB through the operation section 40, the supervisory controller 110 detects the request and starts a process of the operation described below.

At a step 5a, at first, the supervisory controller 110 provides the user setting input section 101 with instructions. Then, the user setting input section 101 accepts setting of viewing DTTB from the user through the operation section 40. The user setting input section 101 notifies the supervisory controller 110 of the obtained user setting. Then, the supervisory controller 110 produces the image processing setting information on the basis of the notified user setting, and the process moves on to a step 5b.

The above image processing setting information includes pieces of information regarding, e.g., which of one-segment and full-segment broadcasting the broadcast receiver 60 receives relating to demultiplexing by means of the demultiplexer 1071, whether the frame interpolation section 1073 performs the frame interpolation, whether the frame decimating section 1074 performs the frame decimation process, whether the enhancer 1076 performs the enhancement process, whether the correction section 1077 performs the correction process, setting of the display brightness by means of the display controller 108, and so on. These settings are not limited to be made at the start of the viewing process such as the step 5a, and may be made beforehand by the user.

At a step 5b, the supervisory controller 110 provides the illumination intensity input section 102 with instructions. Then, the illumination intensity input section 102 obtains the illumination intensity detected by the illumination intensity detector 70 (detected illumination intensity), and provides the supervisory controller 110 with the detected illumination intensity. After the supervisory controller 110 obtains the detected illumination intensity, the process moves on to a step 5c.

At the step 5c, the supervisory controller 110 provides the remaining battery power estimator 103 with instructions. Then, the remaining battery power estimator 103 estimates the power remaining in the battery 80 (remaining battery power) on the basis of the voltage detected by the voltage detector 90. The remaining battery power estimator 103 provides the supervisory controller 110 with the estimated remaining battery power. After the supervisory controller 110 obtains the remaining battery power, the process moves on to a step 5d.

At the step 5d, the supervisory controller 110 provides the received image processor 107, the display controller 108 and so on with instructions so that the DTTB image is displayed and the user can view the DTTB program, and provides the EPG input section 104 with instructions. Then, the EPG input section 104 obtains the electronic program guide from the broadcasting data received by the broadcast receiver 60, and provides the supervisory controller 110 with the electronic program guide. After the supervisory controller 110 obtains the electronic program guide, the process moves on to a step 5e.

At the step 5e, the supervisory controller 110 performs an arithmetic operation for estimating the consumed current value that relates to viewing DTTB on the basis of the operation setting of each of the portions represented by the above image processing setting information, the detected illumination intensity obtained at the step 5b, and the program genre information based on the electronic program guide obtained at the step 5d. After the supervisory controller 110 estimates the consumed current value, the process moves on to a step 5f.

The supervisory controller 110 performs the above arithmetic operation with reference to a table prepared beforehand. The table includes data each of which is associated with the operation setting of each of the portions, the detected illumination intensity or the program genre information. The supervisory controller 110 may add to the detected current value a current value consumed while the apparatus is working as a mobile phone and is waiting for a call.

At the step 5f, the supervisory controller 110 estimates battery lasting time, i.e., remaining time to continue viewing DTTB, and then the process moves on to a step 5g.

At the step 5g, the supervisory controller 110 detects an end time of the program that is currently viewed from the electronic program guide and compares the end time with the present time counted by the controller 100 (or time data included in the broadcasting signal), so as to estimate remaining time of the current program. The supervisory controller 110 compares the remaining time of the program with the remaining time to continue viewing DTTB, so as to judge whether the remaining battery power is enough to allow the user to continue viewing the current program to the end. If the user is allowed to continue viewing, the process ends. If the user is not allowed to continue viewing, the process moves on to a step 5h. After the process ends, the supervisory controller 110 repeats the process shown in FIG. 5 each time some operation is done through the operation section 40 such as changing a channel to be viewed.

At the step 5h, the supervisory controller 110 judges whether the control information has been obtained from the server on the Internet. If the supervisory controller 110 has obtained the control information, the process moves on to a step 5j. If not, the process moves on to a step 5i.

At the step 5i, the supervisory controller 110 provides the server access controller 106 with instructions. Then, the server access controller 106 controls the radio communication section 10, joins the mobile communication network NW through the base station BS, connects to the pre-selected server, obtains the control information from the server and provides the supervisory controller 110 with the control information. The supervisory controller 110 stores the above control information, and the process moves on to the step 5j.

At the step 5j, the supervisory controller 110 updates the image processing setting information on the basis of the control information obtained at the step 5i. Then, the process moves on to the step 5e. Assume, e.g., that the genre of the program that is currently viewed is "movie". If the process moves on to the step 5j for the first time, the frame interpolation by means of the frame interpolation section 1073 is updated not to be performed in the image processing setting information, as a turn-off of the frame interpolation is given the first priority in the control information as indicated by "Ex A" in FIG. 4.

If the process moves on to the step 5j for the second time, the enhancement process by means of the enhancer 1076 is updated not to be performed in the image processing setting information, as a turn-off of the enhancement process is given the second priority in the control information as indicated by "Ex A" in FIG. 4. If the process similarly moves on to the step 5j for the third time, the frame decimation process by means of the frame decimating section 1074 is updated to be performed in the image processing setting information, as a turn-on of the frame decimation process is given the third priority in the control information.

If the process moves on to the step 5j for the fourth time, the setting of the operation of the demultiplexer 1071 is updated so as to switch over from receiving full-segment broadcasting to receiving one-segment broadcasting in the image processing setting information, as switching over to one-segment is given the fourth priority in the control information as indicated by "Ex A" in FIG. 4.

If the process moves on to the step 5j for the fifth time, the correction process by means of the correction section 1077 is updated not to be performed in the image processing setting information, as a turn-off of the gradation and the color correction process is given the fifth priority in the control information as indicated by "Ex A" in FIG. 4. If the process similarly moves on to the step 5j for the sixth time, the setting of the brightness is updated to decrease in the image processing setting information, as brightness decreasing is given the sixth priority in the control information as indicated by "Ex A" in FIG. 4.

The portable electronic apparatus configured as described above selectively turns on or off the image quality control functions (by means of the frame interpolation section 1073, the frame decimating section 1074, the enhancer 1076 and the correction section 1077) in accordance with the power remaining in the battery 80. Thus, the portable electronic apparatus turns off the image quality control functions if little power remains in the battery 80, so as to prevent disturbance of the call waiting status.

The portable electronic apparatus of the invention judges whether the user is allowed to continue viewing the program to the end on the basis of the settings of the image processing for viewing the program, the remaining battery power, the remaining time of the program and so on. The portable electronic apparatus of the invention updates the settings of image processing and so on so as to consume less power, and to enable the user to continue viewing the program to the end.

Thus, according to the portable electronic apparatus configured as described above, a nuisance such that a user cannot view a program to the end is made less possible so that convenience of the user increases. The step 5g can be modified in such a way as to compare the remaining battery power with a sum of the power required for call waiting for a certain period of time and the power required for viewing the program to the end, so that a nuisance such that the intrinsic communication function cannot be used in case of need is made less possible.

The portable electronic apparatus of the invention selectively turns on or off the plural image quality control functions in the preset order, so as to keep best image quality that meets the remaining battery power and to extend battery lasting time as much as possible. As the above order is set in accordance with the genre of the program to be viewed, the image quality control function that is suitable for the genre of the program can be preferably applied so that the image quality that meets the remaining battery power can be kept.

The present invention is not limited to the above embodiments as they are, and can be implemented by modifying the portions of the above embodiments within the scope of the present invention. Various inventions may be formed by properly combining the plural portions of the above embodiments. Another configuration may be conceived by removing some of the above portions. The portions of the different embodiments may be properly combined.

For example, the portable electronic apparatus is not limited to that of the above embodiments obtaining the control information from the server on the Internet, and may use the control information stored in the memory section 50 beforehand at the step 5j.

The portable electronic apparatus is not limited to that of the above embodiments receiving the DTTB signal, and may show a picture to be viewed based on streaming data downloaded through the Internet by using the radio communication section 10.

The particular hardware or software implementation of the present invention may be varied while still remaining within the scope of the present invention. It is therefore to be understood that within the scope of the appended claims and their equivalents, the invention may be practiced otherwise than as specifically described herein.

What is claimed is:

1. A portable electronic apparatus configured to be battery powered and to display a visual program received from the outside, comprising:
    a receiver configured to receive Electronic Program Guide (EPG) data related to the program from the outside;
    a battery power estimator configured to detect a battery output and to estimate remaining battery power on the basis of the detected battery output;
    an image processor configured to process an image included in the program by using a plurality of functions of image quality control;
    a controller configured to set how to use each of the functions by means of the image processor, the controller being configured to estimate battery lasting time on the basis of the remaining battery power, a setting of the use of the functions and the EPG data, the controller being configured to update the setting of the use of the functions upon judging the remaining battery power to be short of enough to display the program to the end; and
    a communication section configured to receive control information from the outside, the control information defining an order of the functions in the setting of the use of the functions, wherein
    the controller is further configured to update the setting of the use of the functions in the order defined by the control information upon judging the remaining battery power to be short of enough to display the program to the end.

2. The portable electronic apparatus of claim 1, further comprising an operation section to be operated by a user, wherein the controller is further configured to initially set how to use each of the functions as directed by the user through the operation section.

3. The portable electronic apparatus of claim 1, wherein the functions of the image quality control includes at least one of selection of the number of radio frequency segments that carries the received program, frame interpolation, frame decimation, edge enhancement, gradation/color correction and display brightness control.

4. The portable electronic apparatus of claim 1, further comprising an illumination intensity detector configured to detect illumination intensity, wherein the controller is configured to estimate the battery lasting time on the basis of the remaining battery power, the setting of the use of the functions, the EPG data and the detected illumination intensity.

5. The portable electronic apparatus of claim 1, wherein the controller is configured to estimate the battery lasting time with reference to a table that associates the remaining battery power, the setting of the use of the functions and the EPG data with the battery lasting time.

6. The portable electronic apparatus of claim 1, wherein the receiver is configured to receive digital terrestrial television broadcasting.

7. The portable electronic apparatus of claim 1, wherein the receiver is configured to receive streaming data through the Internet.

8. A portable electronic apparatus configured to be battery powered and to display a visual program received from the outside, comprising:
    a receiver configured to receive Electronic Program Guide (EPG) data related to the program from the outside;
    a battery power estimator configured to detect a battery output and to estimate remaining battery power on the basis of the detected battery output;
    an image processor configured to process an image included in the program by using a plurality of functions of image quality control;
    a controller configured to set how to use each of the functions by means of the image processor, the controller being configured to estimate battery lasting time on the basis of the remaining battery power, a setting of the use of the functions and the EPG data, the controller being configured to update the setting of the use of the functions upon judging the remaining battery power to be short of enough to display the program to the end; and
    a communication section configured to receive control information from the outside, the control information defining an order of the functions in the setting of the use of the functions, the control information corresponding to a genre of the program, the genre being included in the EPG data, wherein
    the controller is further configured to update the setting of the use of the functions in the order defined by the control information upon judging the remaining battery power to be short of enough to display the program to the end.

9. The portable electronic apparatus of claim 8, further comprising an operation section to be operated by a user, wherein the controller is further configured to initially set how to use each of the functions as directed by the user through the operation section.

10. The portable electronic apparatus of claim 8, wherein the functions of the image quality control includes at least one of selection of the number of radio frequency segments that carries the received program, frame interpolation, frame decimation, edge enhancement, gradation/color correction and display brightness control.

11. The portable electronic apparatus of claim 8, further comprising an illumination intensity detector configured to detect illumination intensity, wherein the controller is configured to estimate the battery lasting time on the basis of the remaining battery power, the setting of the use of the functions, the EPG data and the detected illumination intensity.

12. The portable electronic apparatus of claim 8, wherein the controller is configured to estimate the battery lasting time with reference to a table that associates the remaining battery power, the setting of the use of the functions and the EPG data with the battery lasting time.

13. The portable electronic apparatus of claim 8, wherein the receiver is configured to receive digital terrestrial television broadcasting.

14. The portable electronic apparatus of claim 8, wherein the receiver is configured to receive streaming data through the Internet.

15. A portable electronic apparatus configured to be battery powered and to display a visual program received from the outside, comprising:
    a receiver configured to receive Electronic Program Guide (EPG) data related to the program from the outside;
    a battery power estimator configured to detect a battery output and to estimate remaining battery power on the basis of the detected battery output;

an image processor configured to process an image included in the program by using a plurality of functions of image quality control;

a controller configured to set how to use each of the functions by means of the image processor, the controller being configured to estimate battery lasting time on the basis of the remaining battery power, a setting of the use of the functions and the EPG data, the controller being configured to update the setting of the use of the functions upon judging the remaining battery power to be short of enough to display the program to the end; and a communication section configured to receive control information from the outside, the control information defining an order of the functions in the setting of the use of the functions, wherein the controller is further configured to set how to use a first one of the functions, to estimate the battery lasting time, and to set how to use a second one of the functions next to the first one in the order defined by the control information upon judging the remaining battery power to be short of enough to display the program to the end in a repeated manner.

16. The portable electronic apparatus of claim 15, further comprising an operation section to be operated by a user, wherein the controller is further configured to initially set how to use each of the functions as directed by the user through the operation section.

17. The portable electronic apparatus of claim 15, wherein the functions of the image quality control includes at least one of selection of the number of radio frequency segments that carries the received program, frame interpolation, frame decimation, edge enhancement, gradation/color correction and display brightness control.

18. The portable electronic apparatus of claim 15, further comprising an illumination intensity detector configured to detect illumination intensity, wherein the controller is configured to estimate the battery lasting time on the basis of the remaining battery power, the setting of the use of the functions, the EPG data and the detected illumination intensity.

19. The portable electronic apparatus of claim 15, wherein the controller is configured to estimate the battery lasting time with reference to a table that associates the remaining battery power, the setting of the use of the functions and the EPG data with the battery lasting time.

20. The portable electronic apparatus of claim 15, wherein the receiver is configured to receive digital terrestrial television broadcasting.

21. The portable electronic apparatus of claim 15, wherein the receiver is configured to receive streaming data through the Internet.

22. A portable electronic apparatus configured to be battery powered and to display a visual program received from the outside, comprising:

a receiver configured to receive Electronic Program Guide (EPG) data related to the program from the outside;

a battery power estimator configured to detect a battery output and to estimate remaining battery power on the basis of the detected battery output;

an image processor configured to process an image included in the program by using a plurality of functions of image quality control;

a controller configured to set how to use each of the functions by means of the image processor, the controller being configured to estimate battery lasting time on the basis of the remaining battery power, a setting of the use of the functions and the EPG data, the controller being configured to update the setting of the use of the functions upon judging the remaining battery power to be short of enough to display the program to the end; and a radio communication section configured to perform radio communication to and from the outside, wherein the controller is configured to estimate the battery lasting time on the basis of the remaining battery power, the setting of the use of the functions, the EPG data and estimated power consumption while waiting for a call by way of the radio communication.

23. The portable electronic apparatus of claim 22, further comprising an operation section to be operated by a user, wherein the controller is further configured to initially set how to use each of the functions as directed by the user through the operation section.

24. The portable electronic apparatus of claim 22, wherein the functions of the image quality control includes at least one of selection of the number of radio frequency segments that carries the received program, frame interpolation, frame decimation, edge enhancement, gradation/color correction and display brightness control.

25. The portable electronic apparatus of claim 22, further comprising an illumination intensity detector configured to detect illumination intensity, wherein the controller is configured to estimate the battery lasting time on the basis of the remaining battery power, the setting of the use of the functions, the EPG data and the detected illumination intensity.

26. The portable electronic apparatus of claim 22, wherein the controller is configured to estimate the battery lasting time with reference to a table that associates the remaining battery power, the setting of the use of the functions and the EPG data with the battery lasting time.

27. The portable electronic apparatus of claim 22, wherein the receiver is configured to receive digital terrestrial television broadcasting.

28. The portable electronic apparatus of claim 22, wherein the receiver is configured to receive streaming data through the Internet.

29. A method for displaying an image by means of a portable electronic apparatus configured to be battery-powered, the image being included in a program received from the outside of the portable electronic apparatus, comprising:

receiving Electronic Program Guide (EPG) data related to the program from the outside;

detecting a battery output;

estimating remaining battery power on the basis of the detected battery output;

setting how to use each of a plurality of functions of image quality control to be used for processing the image;

estimating battery lasting time on the basis of the remaining battery power, a setting of the use of the functions and the EPG data;

changing the setting of the use of the functions upon the remaining battery power being judged to be short of enough to display the program to the end; and receiving control information from the outside of the portable electronic apparatus, the control information defining an order of the functions in the setting of the use of the functions, wherein the setting of the use of the functions is updated in the order defined by the control information upon the remaining battery power being judged to be short of enough to display the program to the end.

30. The method for displaying an image of claim 29, wherein the setting of the use of the functions is initially provided by a user's operation.

31. The method for displaying an image of claim 29, wherein the functions of the image quality control includes at least one of selection of the number of radio frequency segments that carries the received program, frame interpolation, frame decimation, edge enhancement, gradation/color correction and display brightness control.

32. A method for displaying an image by means of a portable electronic apparatus configured to be battery-powered, the image being included in a program received from the outside of the portable electronic apparatus, comprising:
receiving Electronic Program Guide (EPG) data related to the program from the outside;
detecting a battery output;
estimating remaining battery power on the basis of the detected battery output;
setting how to use each of a plurality of functions of image quality control to be used for processing the image;
estimating battery lasting time on the basis of the remaining battery power, a setting of the use of the functions and the EPG data;
changing the setting of the use of the functions upon the remaining battery power being judged to be short of enough to display the program to the end; and
receiving control information from the outside of the portable electronic apparatus, the control information defining an order of the functions in the setting of the use of the functions, the control information corresponding to a genre of the program, the genre being included in the EPG data, wherein
the setting of the use of the functions is updated in the order defined by the control information upon the remaining battery power being judged to be short of enough to display the program to the end.

33. The method for displaying an image of claim 32, wherein the setting of the use of the functions is initially provided by a user's operation.

34. The method for displaying an image of claim 32, wherein the functions of the image quality control includes at least one of selection of the number of radio frequency segments that carries the received program, frame interpolation, frame decimation, edge enhancement, gradation/color correction and display brightness control.

35. A method for displaying an image by means of a portable electronic apparatus configured to be battery-powered, the image being included in a program received from the outside of the portable electronic apparatus, comprising:
receiving Electronic Program Guide (EPG) data related to the program from the outside;
detecting a battery output;
estimating remaining battery power on the basis of the detected battery output;
setting how to use each of a plurality of functions of image quality control to be used for processing the image;
estimating battery lasting time on the basis of the remaining battery power, a setting of the use of the functions and the EPG data;
changing the setting of the use of the functions upon the remaining battery power being judged to be short of enough to display the program to the end;
receiving control information from the outside of the portable electronic apparatus, the control information defining an order of the functions in the setting of the use of the functions, and
setting how to use a first one of the functions, estimating the battery lasting time, and
setting how to use a second one of the functions next to the first one in the order defined by the control information upon the remaining battery power being judged to be short of enough to display the program to the end in a repeated manner.

36. The method for displaying an image of claim 35, wherein the setting of the use of the functions is initially provided by a user's operation.

37. The method for displaying an image of claim 35, wherein the functions of the image quality control includes at least one of selection of the number of radio frequency segments that carries the received program, frame interpolation, frame decimation, edge enhancement, gradation/color correction and display brightness control.

* * * * *